(12) United States Patent
Sun et al.

(10) Patent No.: US 9,040,983 B2
(45) Date of Patent: *May 26, 2015

(54) PASSIVATION LAYER STRUCTURE OF SEMICONDUCTOR DEVICE AND METHOD FOR FORMING THE SAME

(71) Applicant: Industrial Technology Research Institute, Hsinchu (TW)

(72) Inventors: Wen-Ching Sun, Taoyuan County (TW); Tzer-Shen Lin, Hsinchu (TW); Sheng-Min Yu, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/058,403

(22) Filed: Oct. 21, 2013

(65) Prior Publication Data

US 2014/0042440 A1    Feb. 13, 2014

Related U.S. Application Data

(63) Continuation-in-part of application No. 13/084,486, filed on Apr. 11, 2011, now Pat. No. 8,564,104.

(30) Foreign Application Priority Data

Oct. 29, 2010    (TW) .............................. 99137154 A

(51) Int. Cl.
*H01L 29/24*        (2006.01)
*H01L 31/0216*    (2014.01)
(Continued)

(52) U.S. Cl.
CPC ...... *H01L 31/02167* (2013.01); *H01L 29/0607* (2013.01); *H01L 21/02282* (2013.01); *C23C 18/1216* (2013.01); *C23C 18/1245* (2013.01); *C23C 18/1258* (2013.01);
(Continued)

(58) Field of Classification Search
CPC ..... H01L 29/7869; H01L 29/24; H01L 21/00; H01L 21/16; H01L 21/479
USPC .............................. 257/43, 76, 194, 632, 782
See application file for complete search history.

(56) References Cited

U.S. PATENT DOCUMENTS 4,521,800 A    6/1985    Howe
5,700,383 A    12/1997    Feller et al.
(Continued)

FOREIGN PATENT DOCUMENTS

DE    10057296    6/2002
EP    1489667    12/2004

OTHER PUBLICATIONS

Hoex B et al; "Excellent passivation of highly doped p-type Si surfaces by the negative-charge-dielectric A1203," Applied Physics Letters, Sep. 2007, pp. 112107-1-112107-3, vol. 91, No. 11, American Institute of Physics, US.

(Continued)

*Primary Examiner* — Monica D Harrison

(57) ABSTRACT

A passivation layer structure of a semiconductor device is provided, which includes a passivation layer formed of halogen-doped aluminum oxide and disposed on a semiconductor layer on a substrate, in which the semiconductor layer includes indium gallium zinc oxide (IGZO) or nitride-based III-V compounds. A method for forming the passivation layer structure of a semiconductor device is also disclosed.

24 Claims, 7 Drawing Sheets

(51) Int. Cl.
| | |
|---|---|
| *H01L 29/06* | (2006.01) |
| *H01L 21/02* | (2006.01) |
| *C23C 18/12* | (2006.01) |
| *H01L 31/0224* | (2006.01) |
| *H01L 31/068* | (2012.01) |
| *H01L 31/18* | (2006.01) |
| *H01L 29/66* | (2006.01) |
| *H01L 33/44* | (2010.01) |
| *H01L 29/20* | (2006.01) |

(52) U.S. Cl.
CPC ........ *C23C 18/1287* (2013.01); *C23C 18/1291* (2013.01); *H01L 31/022425* (2013.01); *H01L 31/068* (2013.01); *H01L 31/1868* (2013.01); *Y02E 10/547* (2013.01); *H01L 21/02178* (2013.01); *H01L 29/66462* (2013.01); *H01L 33/44* (2013.01); *H01L 29/2003* (2013.01)

(56) References Cited

U.S. PATENT DOCUMENTS

| | | | |
|---|---|---|---|
| 7,659,475 | B2 | 2/2010 | Agostinelli et al. |
| 8,030,663 | B2 * | 10/2011 | Yamazaki et al. ............... 257/78 |
| 8,564,104 | B2 * | 10/2013 | Sun et al. ...................... 257/632 |
| 2003/0169968 | A1 | 9/2003 | Bazylenko et al. |
| 2005/0022863 | A1 | 2/2005 | Agostinelli et al. |

OTHER PUBLICATIONS

European Patent Office, European Search Report, Application No. 11003196.0, Sep. 26, 2013, Europe.

J. Schmidt et al., "Surface Passivation of High-Effciency Silicon Solar Cells by Atomic-Layer-Deposited $Al_2O_3$," Prog. Photovolte: Res. Appl. Sep. 2008, vol. 16, Issue 6, pp. 461-466, Wiley, US.

D. Konig et al., "Field Effect of Fixed Negative Charges on Oxidized Silicon Induced by $AlF_3$ Layers with Fluorine Deficiency," Applied Surface Science, Jul. 2004, pp. 222-227, vol. 234, Elsevier, US.

Juho Song et al., "High Quality Fluorinated Silicon Oxide Films Prepared by Plasma Enhanced Chemical Vapor Deposition at 120° C.," Applied Physics Letters, pp. 1876-1878, Sep. 1996, vol. 69, Issue 13, American Institute of Physics, US.

Sung Woo Kim et al., "Characteristics of $Al_2O_3$ Gate Dielectrics Partially Fluorinated by a Low Energy Fluorine Beam," Applied Physics Letters, Nov. 2008, 3 pages, vol. 93, American Institute of Physics, US.

M. Aguilar-Frutis et al., A Study of the Dielectric Characteristics of Aluminum Oxide Thin Films Deposited by Spray Pyrolysis from $Al(acac)_3$, Thin Solid Films, May 2001, pp. 200-206, vol. 389, Elsevier, US.

B. Hoex et al., "Ultralow Surface Recombination of *c*-Si Substrated Passivated by Plasma-Assisted Atomic Layer Deposited $Al_2O_3$," Applied Physics Letters, Jul. 2006, 3 pages, vol. 89, American Institute of Physics, US.

D. Konig et al., "Band Diagram of the $AlF_3/SiO_2/Si$ System", Journal of Applied Physics 97, Apr. 2005, , pp. 093707-1-093707-9, American Institute of Physics, US.

D. Konig et al., "The Negatively Charged Insulator-Semiconductor Structure: Concepts, Technological Consideration and Applications", Solid-State Electronics, Jan. 2000, pp. 111-116, vol. 44, Elsevier Science Ltd., US.

China Patent Office, Office Action, Patent Application Serial No. 201010555848.2, Jul. 29, 2014, China.

* cited by examiner

PASSIVATION LAYER STRUCTURE OF SEMICONDUCTOR DEVICE AND METHOD FOR FORMING THE SAME

CROSS REFERENCE TO RELATED APPLICATIONS

The present application is a continuation-in-part of prior application Ser. No. 13/084,486, filed on Apr. 11, 2011, which is based on, and claims priority from, Taiwan Application Serial Number 099137154, filed on Oct. 29, 2010, the entirety of which is incorporated by reference herein.

BACKGROUND

1. Technical Field

The disclosure relates to a semiconductor device, and in particular relates to a semiconductor device having a passivation layer.

2. Description of the Related Art

Due to the gradual depletion of conventional fossil fuels and the environmental impact caused by using fossil fuels, development of alternative energy sources with low pollution and high electrical efficiency is becoming more and more important.

Among the variety of developed new energy sources, solar cells are capable of transforming free and non-exhausted sunlight into electrical energy for use. Different from thermal electric power from fossil fuel which needs a plurality of energy transformation steps, solar cells are capable of directly transforming light into electrical energy, providing high electrical efficiency. In addition, no pollutant such as carbon dioxide or carbon oxide is generated during the operation of solar cells.

The operation principle of solar cells uses photon from light to activate the formation of electron-hole pairs in a semiconductor and directs the electrons out through a conducting route for use. However, the electron-hole pairs may be recombined before being directed out such that the electrical efficiency is reduced.

Therefore, in order to further improve the electrical efficiency of solar cells, being able to prevent the recombination between electrons and holes before electrons are directed out is getting more important.

SUMMARY

According to an embodiment of the disclosure, a passivation layer structure of a semiconductor device for disposed on a semiconductor substrate is provided, which includes a passivation layer structure disposed on the semiconductor substrate, wherein the passivation layer structure includes a halogen-doped aluminum oxide layer.

According to an embodiment of the disclosure, a method for forming the passivation layer structure of a semiconductor device mentioned above is provided, wherein the semiconductor substrate is a p-type semiconductor layer and the formation step of forming the halogen-doped aluminum oxide layer, which comprises: applying a solution on a surface of the p-type semiconductor layer, wherein the solution comprises an aluminum-containing compound solution and a halogen-containing compound solution; and heating the p-type semiconductor layer to a temperature such that the solution transforms into the halogen-doped aluminum oxide layer.

According to an embodiment of the disclosure, a passivation layer structure of a semiconductor device is provided, which includes a semiconductor layer disposed on a substrate, wherein a surface of the semiconductor layer comprises metal oxides or nitride-based III-V compounds. A passivation layer structure is disposed on the semiconductor layer, wherein the passivation layer structure comprises a halogen-doped aluminum oxide layer including an aluminum oxide layer and at least a halogen dopant doped therein.

According to an embodiment of the disclosure, a method for forming the passivation layer structure of a semiconductor device mentioned above is provided, wherein the formation of the halogen-doped aluminum oxide layer comprises: applying a solution on the surface of the semiconductor layer, wherein the solution comprises an aluminum-containing compound solution and a halogen-containing compound solution; and heating the semiconductor layer to a temperature, such that the solution transforms into the halogen-doped aluminum oxide layer.

According to an embodiment of the disclosure, a passivation layer structure of a high electron mobility transistor (HEMT) is provided, which includes a semiconductor layer disposed on a substrate, wherein a surface of the semiconductor layer comprises intrinsic or n-type III-V compounds. A passivation layer structure is disposed on the semiconductor layer, wherein the passivation layer structure comprises a halogen-doped aluminum oxide layer including an aluminum oxide layer and at least a halogen dopant doped therein.

According to an embodiment of the disclosure, a method for forming the passivation layer structure of a high electron mobility transistor (HEMT) mentioned above is provided, wherein the formation of the halogen-doped aluminum oxide layer comprises: applying a solution on the surface of the semiconductor layer, wherein the solution comprises an aluminum-containing compound solution and a halogen-containing compound solution; and heating the semiconductor layer to a temperature, such that the solution transforms into the halogen-doped aluminum oxide layer.

A detailed description is given in the following embodiments with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION

The following description is an embodiment of carrying out the disclosure. This description is made for the general principles of the disclosure and should not be taken in a limiting sense.

It is understood, that the following disclosure provides many difference embodiments, or examples, for implementing different features of the disclosure. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," or "overlying," (and like descriptions) a second layer include embodiments where the first and second layers are in direct contact and those where one or more layers are interposing the first and second layers.

Figure 1:
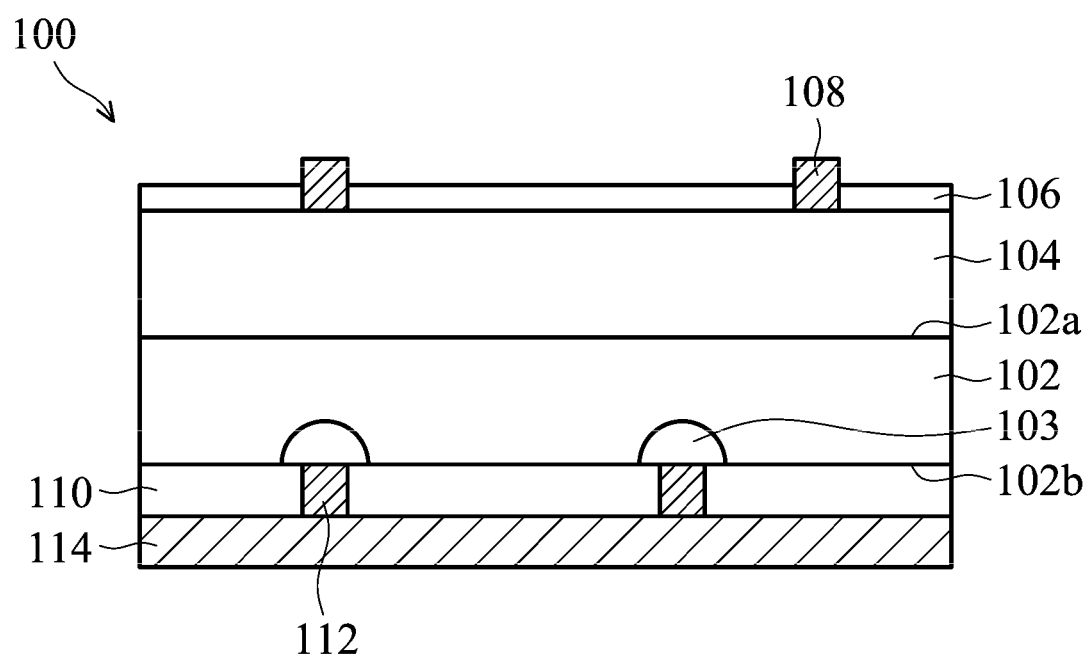
FIG. 1 is a cross-sectional view showing a semiconductor device according to an exemplary embodiment.

FIG. 1 is a cross-sectional view showing a semiconductor device 100 according to an exemplary embodiment. Hereafter, the fabrication method and the structure of the semiconductor device 100 of an exemplary embodiment will be illustrated with reference made to FIG. 1. The semiconductor device 100 may include a variety of electronic products, wherein the semiconductor device 100 may include, for example, a solar cell. In the following description, the semiconductor device 100 implemented as a solar cell as an example will be illustrated. It should be appreciated that exemplary embodiments of the disclosure are not limited to be a semiconductor device implemented as a solar cell. For example, the semiconductor device according to other exemplary embodiments of the disclosure may be implemented as a TFT, an HEMT, a MOS-HEMT, an LED, a photodiode, or a pH sensor.

As shown in FIG. 1, a semiconductor substrate is provided, which includes, for example, a p-type semiconductor layer 102 and a second type semiconductor layer such as an n-type semiconductor layer 104. The n-type semiconductor layer 104 is formed on a surface 102a of the p-type semiconductor layer 102. In one embodiment, a semiconductor substrate such as a silicon substrate is provided. The silicon substrate may be doped with a p-type dopant or an n-type dopant. If the silicon substrate is an n-type substrate, a p-type dopant may be implanted into the n-type substrate through an ion implantation process to transform a portion of the n-type substrate into a p-type semiconductor layer. Thus, the surface 102a of the p-type semiconductor layer may serve as a PN junction between the p-type semiconductor layer 102 and the n-type semiconductor layer 104. Similarly, if the silicon substrate is a p-type substrate, an n-type dopant may be implanted into the p-type substrate through an ion implantation process to transform a portion of the p-type substrate into an n-type semiconductor layer.

A passivation layer structure is formed on a surface 102b of the p-type semiconductor layer 102, which includes a halogen-doped aluminum oxide layer 110. The halogen-doped aluminum oxide layer 110 includes an aluminum oxide layer and at least a halogen dopant doped therein. For example, the halogen-doped aluminum oxide layer 110 may include, but is not limited to, a fluorine doped aluminum oxide layer, chlorine doped aluminum oxide layer, or combinations thereof. In another embodiment, the halogen-doped aluminum oxide layer 110 may include other halogen elements such as bromine or iodine. In one embodiment, a thickness of the halogen-doped aluminum oxide layer may be between about 5 nm and about 200 nm.

Because the halogen-doped aluminum oxide layer 110 has negative fixed charges, a built-in electric field may be generated. When electron-hole pairs are generated due to light irradiation, the negative fixed charges help to attract the holes and distract the electrons away. Thus, the probability of recombination of electrons and holes is reduced such that carrier lifetime is prolonged. Therefore, electrons may be led out (through, for example, an electrode to be formed in the following process) successfully for use.

In the solar cell technique, the fabrication cost is usually very high such that the solar cell is not commonly used. In one embodiment, the halogen-doped aluminum oxide layer 110 in the semiconductor device 100 is formed by applying a solution. Thus, fabrication cost may be significantly reduced. For example, in one embodiment, the halogen-doped aluminum oxide layer 110 is formed by spray coating. In another embodiment, the halogen-doped aluminum oxide layer 110 is formed by spin coating. Compared with growing the halogen-doped aluminum oxide layer 110 by vapor deposition (such as, plasma enhanced chemical vapor deposition (PECVD), atomic layer deposition (ALD), or chemical vapor deposition (CVD)), exemplary embodiments of the disclosure which adopt solution application may significantly reduce fabrication cost and fabrication time, benefiting the popularization of semiconductor devices (e.g., solar cells).

In one embodiment, the formation step of the halogen-doped aluminum oxide layer 110 includes applying a solution on the surface 102b of the p-type semiconductor layer 102. The applied solution includes an aluminum-containing compound solution and a halogen-containing compound solution. The p-type semiconductor layer 102 is then heated to a suitable temperature such that the applied solution is transformed into the halogen-doped aluminum oxide layer 110. The aluminum-containing compound solution in the solution may include, for example, (but is not limited to) aluminum acetylacetonate, aluminum chloride, aluminum nitrate, trimethyl aluminum, or combinations thereof. The halogen-containing compound solution in the solution may include, for example, (but is not limited to) ammonium fluoride, hydrofluoric acid, ammonium chloride, hydrochloric acid, ammonium bromide, hydrobromic acid, or combinations thereof. In one embodiment, a percentage between the mole value of the aluminum compound in the aluminum-containing compound solution and the mole value of the halogen compound in the halogen-containing compound solution is between, for example, 1:0.2 and 1:5. The solution may include a solubilizing agent and/or a solvent such as alcohol, water, acid, or combinations thereof. Typically, after the aluminum-containing compound solution, the halogen-containing compound solution, and the solvent/solubilizing agent are substantially mixed, the solution mentioned above may be applied onto the surface 102b of the p-type semiconductor layer 102 by spray coating, ultrasonic spray coating, or spin coating.

In one embodiment, the substrate including the n-type semiconductor layer 104 and the p-type semiconductor layer 102 may be disposed on a carrier substrate, wherein a temperature of the carrier substrate can be elevated. Then, the solution including the aluminum-containing compound solution and the halogen-containing compound solution is spray coated or spin coated on the surface 102b of the p-type semiconductor layer 102. In the case that the spray coating process is adopted, the carrier substrate may simultaneously elevate the temperature of the n-type semiconductor layer 104 and the p-type semiconductor layer 102 disposed thereon during the step of spray coating the solution. In one embodiment, the p-type semiconductor layer 102 may be heated to be, for example, about 100° C. and about 500° C. It should be appreciated that the heating temperature may be adjusted according to the situation. The temperature needs to be high enough to remove the organic compound portion such that the halogen-doped aluminum oxide layer 110 will remain. However, the temperature should not be too high such that too much defects are generated or halogen elements with small volume are removed. In one embodiment, the solution including the aluminum-containing compound solution and the halogen-containing compound solution is spray coated on the surface 102b of the p-type semiconductor layer 102 by ultrasonic spray coating. The vibration of ultrasonic waves helps to make the formed halogen-doped aluminum oxide layer 110 denser.

In addition, in the case that a spin coating process is adopted, the solution including the aluminum-containing compound solution and the halogen-containing compound solution may be spin coated on the surface 102b of the p-type semiconductor layer 102 to form a film. Subsequently, the p-type semiconductor layer 102 is heated, such that the formed film becomes the halogen-doped aluminum oxide layer 110.

In one embodiment, the doping concentration of halogen in the halogen-doped aluminum oxide layer 110 is between about 0.01% and about 5%. Note that in one embodiment, from the XPS spectrum, it is discovered that the fluorine atoms are located at interstitial sites in the halogen-doped aluminum oxide layer 110. However, it should be appreciated that embodiments of the disclosure are not limited thereto. In another embodiment, the fluorine atoms or other halogen atoms may be located at substitutional sites in the halogen-doped aluminum oxide layer 110.

Still referring to FIG. 1, an electrode 112 electrically connected to the p-type semiconductor layer 102 and an electrode 108 electrically connected to the n-type semiconductor layer 104 are then formed. For example, the formed halogen-doped aluminum oxide layer 110 may be patterned to expose a portion of the p-type semiconductor layer 102. Then, the electrode 112 is formed on the exposed p-type semiconductor layer 102. A conducting layer 114 may further be formed on the halogen-doped aluminum oxide layer 110 and the electrode 112. The materials and formation methods of the electrode 112 or the conducting layer 114 may be known by one skilled in the art and additional descriptions are not repeated herein. In one embodiment, a p-type heavily doped region 103 may have previously been formed on the location, where the p-type semiconductor layer 102 will be formed, to increase the conductivity, benefiting the carrier generated by the photoelectric effect to be directed out for use.

Note that a material layer 106 may be optionally formed on the n-type semiconductor layer 104. The material layer 106 may include, for example, a passivation layer or an antireflective layer. The electrode 108 may be formed on the exposed n-type semiconductor layer 104.

Figure 2A:
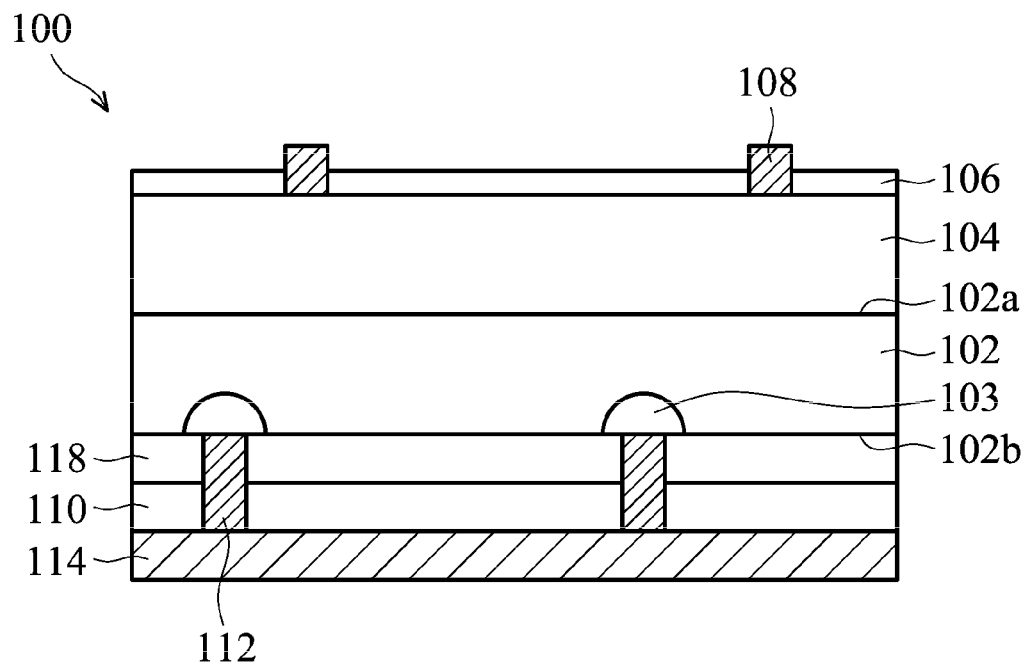
FIG. 2A is a cross-sectional view showing a semiconductor device according to an exemplary embodiment.

FIG. 2A is a cross-sectional view showing a semiconductor device 100 according to an exemplary embodiment. Thereafter, the fabrication method and the structure of a semiconductor device 100 of an embodiment is illustrated with reference made to FIG. 2A. Elements in FIG. 2A that are the same as those in FIG. 1 are labeled with the same reference numbers as in FIG. 1 and are not described again for brevity.

The embodiment shown in FIG. 2A is similar to the embodiment shown in FIG. 1. The main difference therebetween is that for the embodiment shown in FIG. 2A, a passivation layer 118 is formed between the surface 102b of the p-type semiconductor layer 102 and the halogen-doped aluminum oxide layer 110. The passivation layer 118 may be, for example, (but is not limited to) an oxide layer. In one embodiment, the passivation layer 118 directly contacts with the halogen-doped aluminum oxide layer 110. In one embodiment, the passivation layer 118 directly contacts with the p-type semiconductor layer 102. In one embodiment, before the halogen-doped aluminum oxide layer 110 is formed, the passivation layer 118 is formed on the surface 102b of the p-type semiconductor layer 102. Then, the halogen-doped aluminum oxide layer 110 is directly formed on the passivation layer 118. The formation method for the passivation layer 118 may include a chemical vapor deposition process, thermal oxidation process, oxidation process, or coating process.

In one embodiment, the formation of the passivation layer 118 includes performing an oxidation process to the surface 102b of the p-type semiconductor layer 102 to oxidize a portion of the p-type semiconductor layer 102 to be the passivation layer 118. A suitable oxidation process may include a thermal oxidation process or applying an oxidant on the surface 102b of the p-type semiconductor layer 102. In one embodiment, the p-type semiconductor layer 102 is a silicon substrate including p-type dopants. Thus, the formed passivation layer 118 may be a silicon oxide layer including the p-type dopants. In one embodiment, the p-type semiconductor layer 102 is disposed in the air such that the passivation layer 118 is naturally formed on the surface 102b due to the oxidation of the p-type semiconductor layer 102. In this case, the passivation layer 118 is an oxide layer of a semiconductor substrate (i.e., the p-type semiconductor layer 102), wherein a thickness of the passivation layer 118 may be, for example, less than about 5 nm.

In another embodiment, the p-type semiconductor layer 102 may be dipped into a nitric acid solution such that the portion of the p-type semiconductor layer 102 near the surface 102b is oxidized to be an oxide layer (i.e., the passivation layer 118). In one embodiment, a temperature of the nitric acid solution may be controlled to be between about 10° C. and about 120° C. In one embodiment, the dipping time of the p-type semiconductor layer 102 in the nitric acid solution may be about 3 minutes and about 20 minutes.

If the passivation layer 118 is disposed between the p-type semiconductor layer 102 and the halogen-doped aluminum oxide layer 110, the amount of defect generated during the heating process of the halogen-doped aluminum oxide layer 110 may be reduced. The passivation layer 118 is preferable an oxide layer of the p-type semiconductor layer 102 and thus has a structure similar to that of the p-type semiconductor layer 102. Thus, the occurrence of defect is reduced such that the probability of the recombination between electron and hole is accordingly reduced. In one embodiment, a portion of the halogen atoms and/or ions in the halogen-doped aluminum oxide layer 110 may be diffused into the passivation layer 118.

Figure 2B:
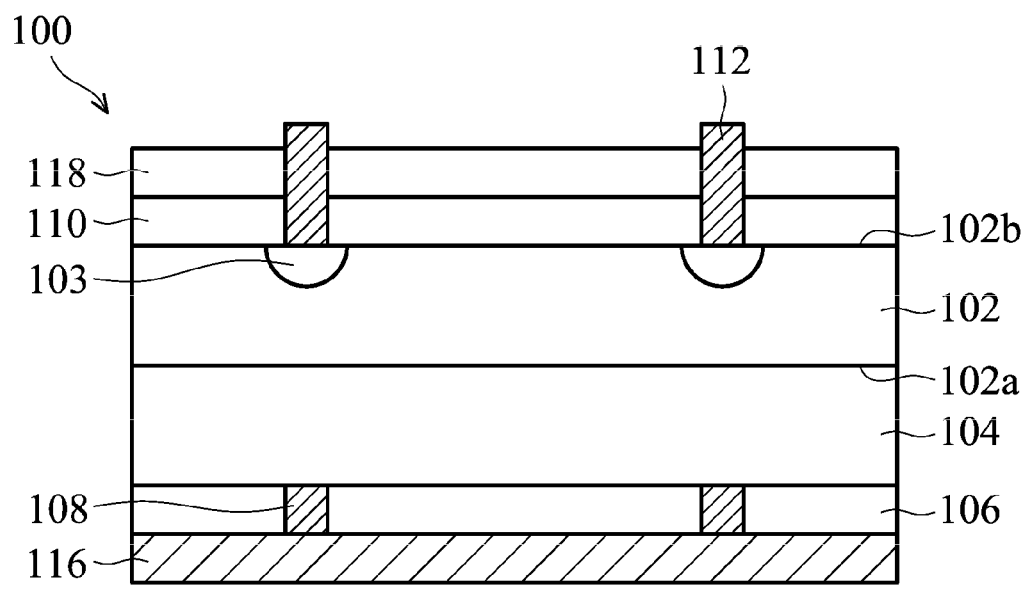
FIG. 2B is a cross-sectional view showing a semiconductor device according to an exemplary embodiment.

FIG. 2B is a cross-sectional view showing a semiconductor device 100 according to an exemplary embodiment. Hereafter, the fabrication method and the structure of a semiconductor device 100 is illustrated with reference made to FIG. 2B. Elements in FIG. 2B that are the same as those in FIG. 2A are labeled with the same reference numbers as in FIG. 2A and are not described again for brevity.

The embodiment shown in FIG. 2B is similar to the embodiment shown in FIG. 2A. The main difference therebetween is that in the embodiment shown in FIG. 2B, the surface 102b of the p-type semiconductor layer 102 is used as the surface for receiving light. In this case, in order to make light (such as sunlight) successfully enter the solar cell to generate the photoelectric effect, the conducting layer 114 is not formed such that the p-type semiconductor layer 102 is exposed. In addition, a conducting layer 116 may be optionally formed on the n-type semiconductor device 104 to help with the collection of the photoelectric current.

Figure 3:
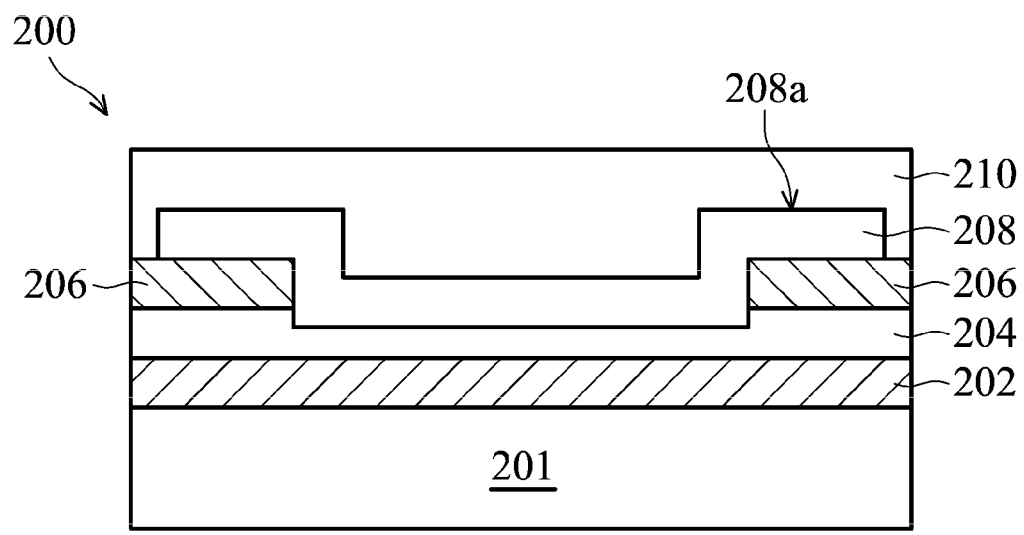
FIG. 3 is a cross-sectional view showing a semiconductor device with an IGZO layer according to an exemplary embodiment.

FIG. 3 is a cross-sectional view showing a semiconductor device 200 according to an exemplary embodiment. Hereafter, the fabrication method and the structure of a semiconductor device 200 is illustrated with reference made to FIG. 3. In the following description, the semiconductor device 200 implemented as a TFT for a display as an example will be illustrated. It should be appreciated that this exemplary embodiment is not limited to be a semiconductor device implemented as a TFT. For example, the semiconductor device 200 may be implemented as a MOS or CMOS transistor.

As shown in FIG. 3, a substrate 201, such as a silicon, quartz, glass or flexible material substrate, is provided. A gate electrode layer 202, a gate dielectric layer 204, and source/drain electrode layers 206 are successively formed on the substrate 201 by suitable deposition and patterning processes. In one embodiment, the gate electrode layer 202 may comprise a MoNb alloy, the gate dielectric layer 204 may comprise silicon nitride (e.g., $Si_3N_4$ or $SiN_x$ (where $0 < x \leq 1.5$)), and the source/drain electrode layers 206 may comprise indium tin oxide (ITO).

Next, a semiconductor layer 208, such as a metal oxide layer, is formed on the gate dielectric layer 204 between the source/drain electrode layers 206 and partially covers the upper surfaces of the source/drain electrode layers 206. In the embodiment, the semiconductor layer 208 serves as an active layer of semiconductor device 200 (i.e., TFT) and comprises metal oxides, such as indium gallium zinc oxide (IGZO), hafnium indium zinc oxide (HIZO), indium tin oxide (ITO), zinc oxide (ZnO), aluminum doped zinc oxide, antimony doped tin oxide, tin doped zinc oxide or fluorine doped tin oxide. The semiconductor layer 208 may be formed by a suitable deposition process.

A passivation layer structure is formed on a surface 208a of the semiconductor layer (e.g., an IGZO layer) 208, which includes a halogen-doped aluminum oxide layer 210. In the embodiment, the material and formation method of the halogen-doped aluminum oxide layer 210 may be similar to or the same as the halogen-doped aluminum oxide layer 110 shown in FIG. 1. Moreover, the halogen-doped aluminum oxide layer 210 may have a thickness between about 10 nm and 400 nm. As mentioned above, since a halogen-doped aluminum oxide layer has negative fixed charges, a built-in electric field may be generated. The negative fixed charges in the halogen-doped aluminum oxide layer 210 help to distract the electrons away from the surface 208a of the semiconductor layer 208. As a result, the surface defects of the semiconductor layer 208 can be reduced, thereby improving the electron mobility of the semiconductor device 200 (i.e., TFT).

Figure 4A:
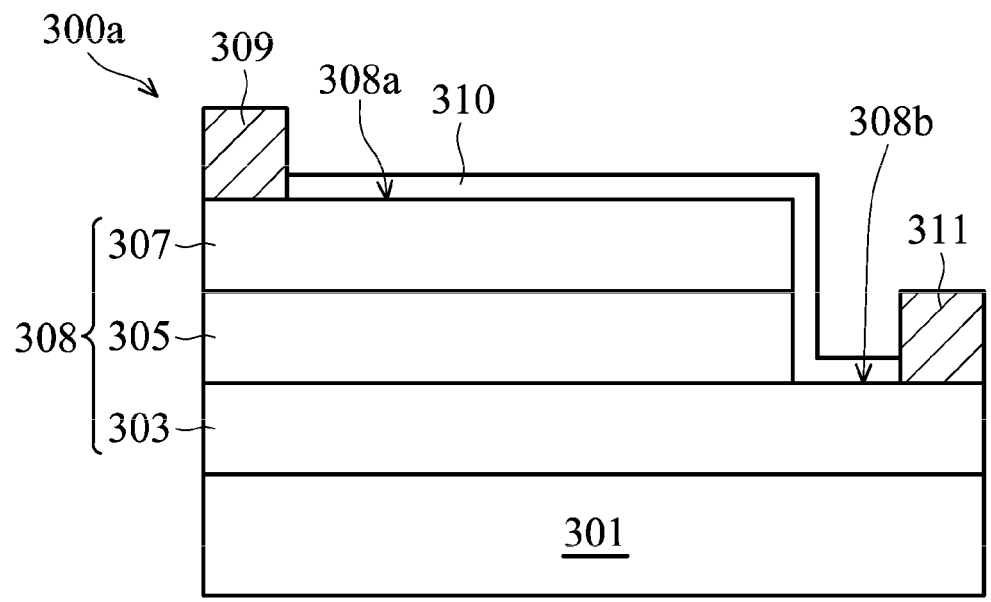
FIG. 4A is a cross-sectional view showing a semiconductor device with a nitride-based III-V compound layer according to an exemplary embodiment.

FIG. 4A is a cross-sectional view showing a semiconductor device 300a according to an exemplary embodiment. Hereafter, the fabrication method and the structure of a semiconductor device 300a is illustrated with reference made to FIG. 4A. In the following description, the semiconductor device 300a implemented as a light-emitting diode (LED) as an example will be illustrated.

As shown in FIG. 4A, a substrate 301, such as a silicon, silicon carbide, or sapphire substrate, is provided. Next, a semiconductor layer 308 is formed on the substrate 301 by suitable deposition (e.g., epitaxial growth) and patterning processes. In the embodiment, the semiconductor layer 308 may comprise a multiple layer structure. For example, the multiple layer structure may comprises a first nitride-based III-V compound semiconductor layer 303 and an overlying second nitride-based III-V compound semiconductor layer 307 having different conductivity types. Moreover, a multiple quantum well (MQW) layer 305 serving as an active layer of the semiconductor device 300a (i.e., LED) is interposed between first and second nitride-based III-V compound semiconductor layers 303 and 307. In one embodiment, the first and second nitride-based III-V compound semiconductor layers 303 and 307 may be formed of n-type gallium nitride (GaN) and p-type GaN, respectively. In another embodiment, the first and second nitride-based III-V compound semiconductor layers 303 and 307 may be formed of p-type gallium nitride (GaN) and n-type GaN, respectively.

Next, a passivation layer structure is formed on a surface of the semiconductor layer 308 to cover the surface 308a of the second nitride-based III-V compound semiconductor layer 307, the surface 308b of the first nitride-based III-V compound semiconductor layer 303, and the sidewalls of the second nitride-based III-V compound semiconductor layer 307 and the MQW layer 305.

In the embodiment, the passivation layer structure includes a halogen-doped aluminum oxide layer 310. The material and formation method of the halogen-doped aluminum oxide layer 310 may be similar to or the same as the halogen-doped aluminum oxide layer 110 shown in FIG. 1. Moreover, the halogen-doped aluminum oxide layer 310 may have a thickness between about 10 nm and 400 nm.

The halogen-doped aluminum oxide layer 310 is patterned to expose a portion of the surface 308a of the second nitride-based III-V compound semiconductor layer 307 and a portion of the surface 308b of the first nitride-based III-V compound semiconductor layer 303. Next, electrode layers 309 and 311 are formed on the exposed portions of the surfaces 308a and 308b, respectively. Similarly, the negative fixed charges in the halogen-doped aluminum oxide layer 310 help to distract the electrons away from the surface of the semiconductor layer 308. As a result, the surface defects of the semiconductor layer 308 can be passivated, thereby increasing light output power and reducing operating voltage of the semiconductor device 300a (i.e., LED).

Figure 4B:
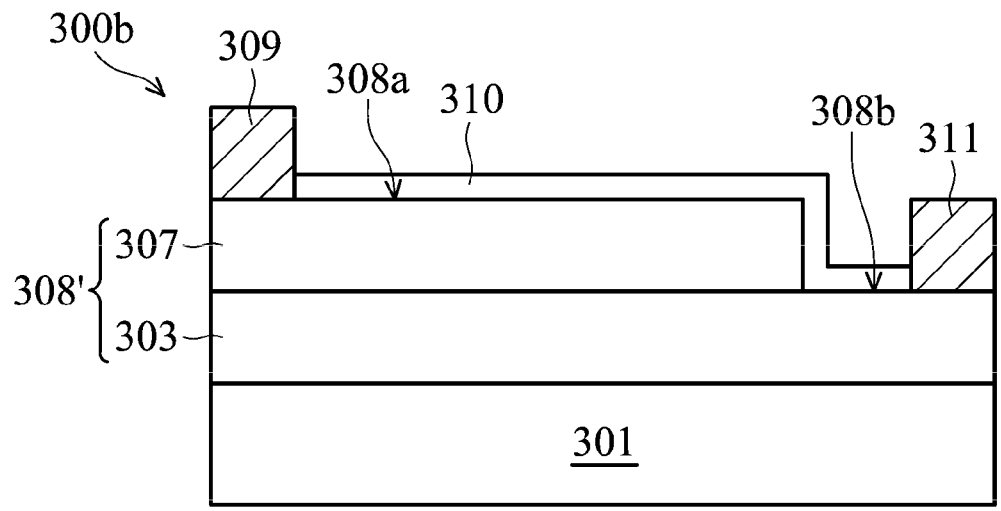
FIG. 4B is a cross-sectional view showing a semiconductor device a nitride-based III-V compound layer according to an exemplary embodiment.

FIG. 4B is a cross-sectional view showing a semiconductor device 300b according to an exemplary embodiment. Elements in FIG. 4B that are the same as those in FIG. 4A are labeled with the same reference numbers as in FIG. 4A and are not described again for brevity. Hereafter, the fabrication method and the structure of a semiconductor device 300b is illustrated with reference made to FIG. 4B. In the following description, the semiconductor device 300b implemented as a photodiode as an example will be illustrated.

The embodiment shown in FIG. 4B is similar to the embodiment shown in FIG. 4A. The main difference therebetween is that in the embodiment shown in FIG. 4B, the semiconductor layer 308' serving as a light absorption layer comprises first and second nitride-based III-V compound semiconductor layers 303 and 307 without a MQW layer therebetween. In one embodiment, the first and second nitride-based III-V compound semiconductor layers 303 and 307 having different conductivity types may be formed GaN or aluminum gallium nitride (AlGaN). In another embodiment, one of the layers 303 and 307 is an intrinsic nitride-based III-V compound semiconductor layer.

Moreover, in the embodiment, the halogen-doped aluminum oxide layer 310 covers the surface 308a and sidewall of the second nitride-based III-V compound semiconductor layer 307 and the surface 308b of the first nitride-based III-V compound semiconductor layer 303. Similarly, the negative fixed charges in the halogen-doped aluminum oxide layer 310 help to distract the electrons away from the surface of the semiconductor layer 308', thereby preventing current density on the surface of the light absorption layer from reducing. As a result, the performance of the semiconductor device 300b (i.e., photodiode).

Figure 5A:
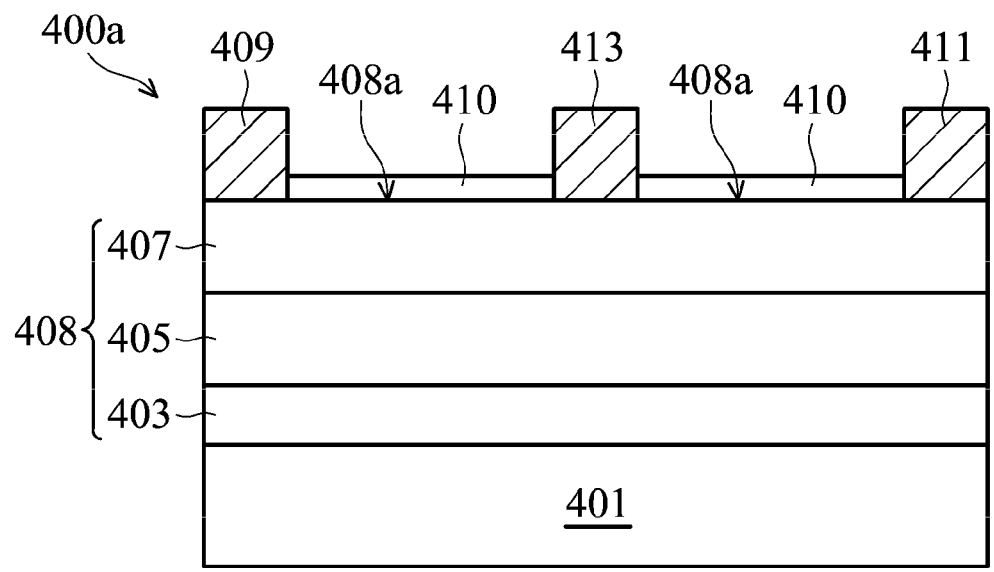
FIG. 5A is a cross-sectional view showing a semiconductor device with a nitride-based III-V compound layer according to an exemplary embodiment.

FIG. 5A is a cross-sectional view showing a semiconductor device 400a according to an exemplary embodiment. Hereafter, the fabrication method and the structure of a semiconductor device 400a is illustrated with reference made to FIG. 5A. In the following description, the semiconductor device 400a implemented as a high electron mobility transistor (HEMT) as an example will be illustrated.

As shown in FIG. 5A, a substrate 401 comprising silicon, germanium, aluminum oxide, or gallium arsenide, is provided. Next, a semiconductor layer 408 having a surface 408a comprising nitride-based III-V compounds is formed on the substrate 401 by suitable deposition (e.g., epitaxial growth) and patterning processes. In the embodiment, the semiconductor layer 408 may comprise a multiple layer structure. For example, the multiple layer structure may comprise a nucleation layer 403 and an overlying active layer including a buffer layer 405 and a barrier layer 407. In one embodiment, the nucleation layer 403 and the buffer layer 405 may comprise GaN and the barrier layer 407 may comprise AlGaN.

Next, a passivation layer structure is formed on the surface 408a of the semiconductor layer 408. In the embodiment, the passivation layer structure includes a halogen-doped aluminum oxide layer 410. The material and formation method of the halogen-doped aluminum oxide layer 410 may be similar to or the same as the halogen-doped aluminum oxide layer 110 shown in FIG. 1. Moreover, the halogen-doped aluminum oxide layer 310 may have a thickness between about 10 nm and 400 nm.

The halogen-doped aluminum oxide layer 410 is patterned to expose portions of the surface 408a of the semiconductor layer 408. Next, a gate electrode layer 413 and source/drain electrode layers 409 and 411 are formed on the exposed portions of the surface 408a. Similarly, the negative fixed charges in the halogen-doped aluminum oxide layer 410 help to distract the electrons away from the surface 408a of the semiconductor layer 408, such that a stable inversion layer can be formed at the junction between the buffer layer 405 and 407 during the semiconductor device 400a is operated. As a result, the electron mobility of the semiconductor device 400a (i.e., HEMT) can be increased.

Figure 5B:
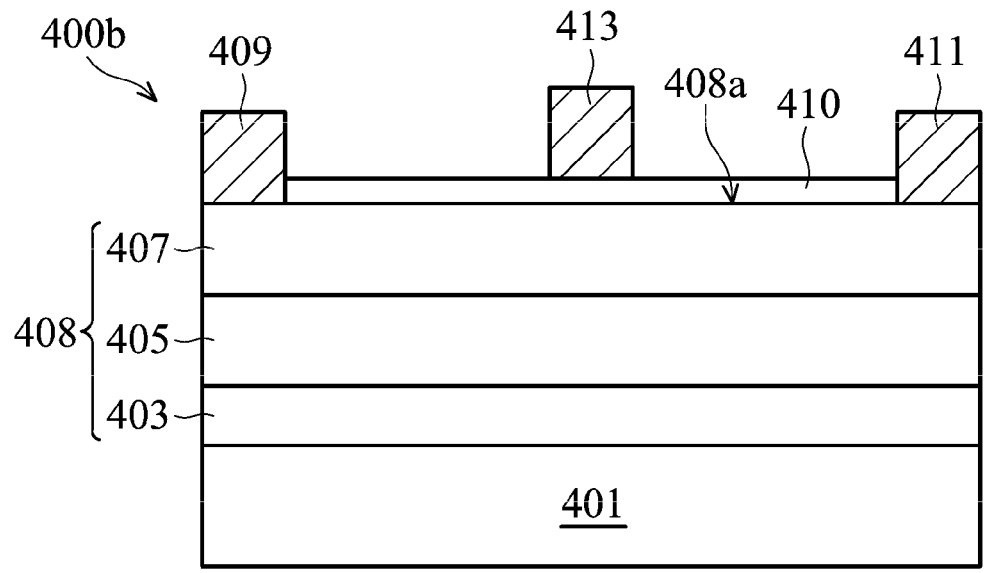
FIG. 5B is a cross-sectional view showing a semiconductor device a nitride-based III-V compound layer according to an exemplary embodiment.

FIG. 5B is a cross-sectional view showing a semiconductor device 400b according to an exemplary embodiment. Elements in FIG. 5B that are the same as those in FIG. 5A are labeled with the same reference numbers as in FIG. 5A and are not described again for brevity. Hereafter, the fabrication method and the structure of a semiconductor device 400b is illustrated with reference to FIG. 5B. In the following description, the semiconductor device 400b implemented as a metal-oxide-semiconductor (MOS)-HEMT as an example will be illustrated.

The embodiment shown in FIG. 5B is similar to the embodiment shown in FIG. 5A. The main difference therebetween is that in the embodiment shown in FIG. 5B, the passivation layer structure (i.e., the halogen-doped aluminum oxide layer 410) also serves as a gate dielectric layer to extend underlying the gate electrode layer 413.

Figure 5C:
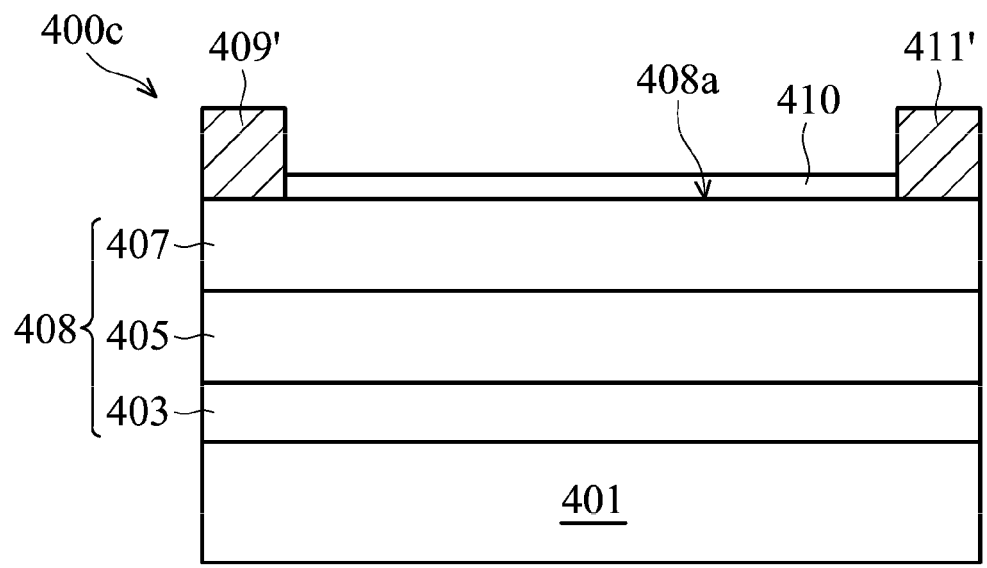
FIG. 5C is a cross-sectional view showing a semiconductor device with a nitride-based III-V compound layer according to an exemplary embodiment.

FIG. 5C is a cross-sectional view showing a semiconductor device 400c according to an exemplary embodiment. Elements in FIG. 5C that are the same as those in FIG. 5A are labeled with the same reference numbers as in FIG. 5A and are not described again for brevity. Hereafter, the fabrication method and the structure of a semiconductor device 400c is illustrated with reference made to FIG. 5C. In the following description, the semiconductor device 400c implemented as a pH sensor with a HEMT structure as an example will be illustrated.

The embodiment shown in FIG. 5C is similar to the embodiment shown in FIG. 5A or 5B. The main difference therebetween is that in the embodiment shown in FIG. 5C, electrode layers 409' and 411' separated by the halogen-doped aluminum oxide layer 410 are formed on the exposed portions of the surface 408a of the semiconductor layer 408. Similarly, the negative fixed charges in the halogen-doped aluminum oxide layer 410 help to distract the electrons away from the surface of the semiconductor layer 408, thereby preventing current density on the surface of the active layer from reducing. As a result, the performance of the semiconductor device 400c (i.e., pH sensor).

Figure 6A:
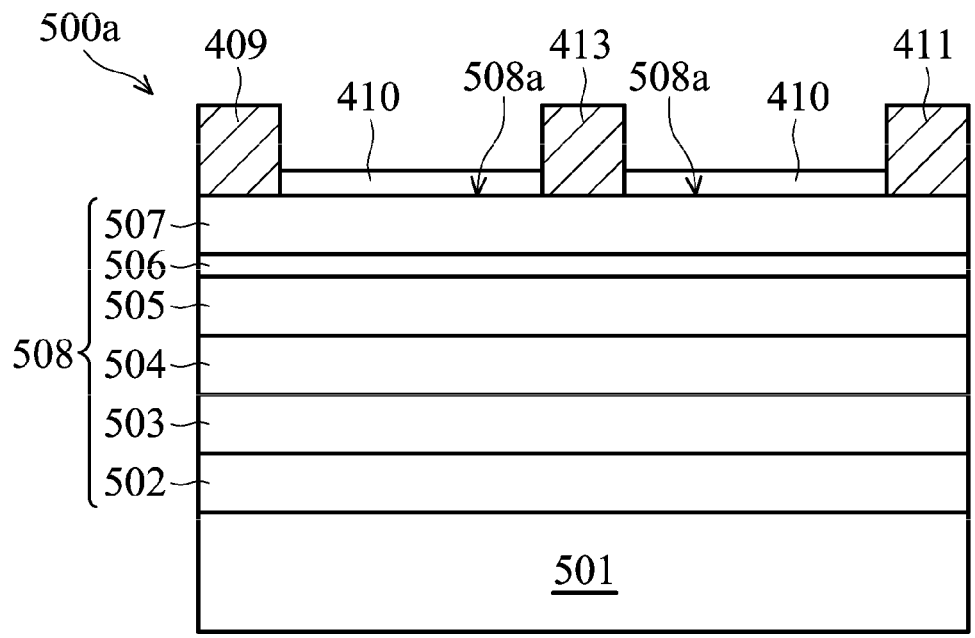
FIGS. 6A to 6C are cross-sectional views showing a semiconductor device with a III-V compound layer according to various exemplary embodiments.
Figure 6B:
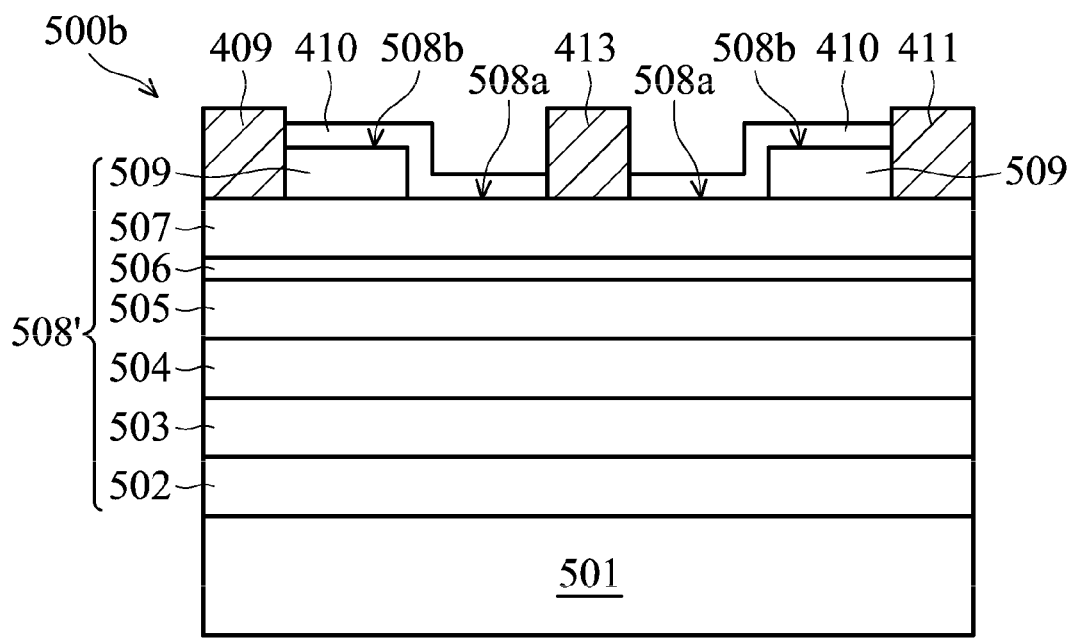
Figure 6C:
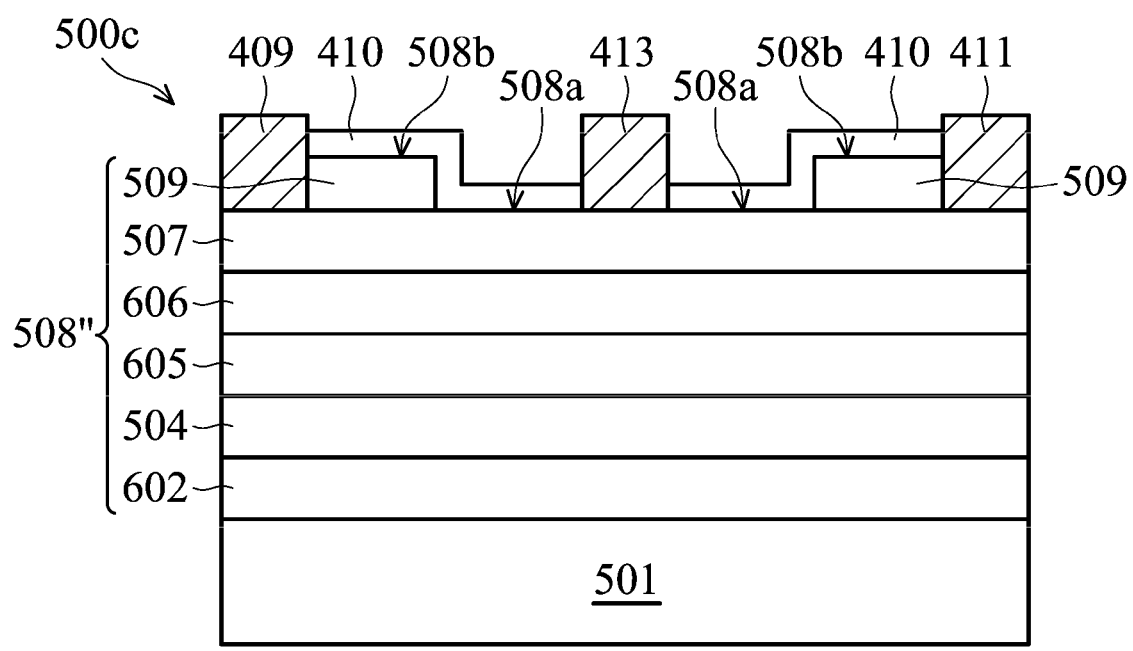

FIGS. 6A to 6C are cross-sectional views showing a semiconductor device with a III-V compound layer according to various exemplary embodiments. Elements in FIGS. 6A to 6C that are the same as those in FIG. 5A are labeled with the same reference numbers as in FIG. 5A and are not described again for brevity. Hereafter, the fabrication method and the structure of semiconductor devices 500a, 500b, and 500c are illustrated with reference made to FIGS. 6A to 6C, respectively. In the following description, the semiconductor devices 500a, 500b, and 500c implemented as a HEMT as an example will be illustrated.

The embodiment shown in FIG. 6A is similar to the embodiment shown in FIG. 5A. The main difference therebetween is that in the embodiment shown in FIG. 6A, a substrate 501 comprising silicon, germanium, aluminum oxide, or gallium arsenide, is provided. Next, a semiconductor layer 508 having a surface 508a comprising III-V compounds is formed on the substrate 501 by suitable deposition (e.g., epitaxial growth) and patterning processes. The semiconductor layer 508 may comprise a multiple layer structure. For example, the multiple layer structure may comprise a stack of a buffer layer 502, a first spacer layer 503, a channel layer 504, a second spacer layer 505, a delta-doping layer 506, and a Schottky contact layer 507. In one embodiment, the buffer layer 502 may comprise a first layer formed of intrinsic GaAs and an overlying second layer formed of intrinsic $Al_xGa_{1-x}As$, where $0<x\leq0.5$. The first and second spacer layers 503 and 505 may be formed of intrinsic $Al_xGa_{1-x}As$, where $0<x\leq0.5$. The channel layer 504 may be formed of $In_xGa_{1-x}As$, where $0<x\leq0.7$. The delta-doping layer 506 may comprise Si doped $Al_xGa_{1-x}As$, where $0<x\leq0.5$, Be doped $Al_xGa_{1-x}As$, where $0<x\leq0.5$, C doped $Al_xGa_{1-x}As$, where $0<x\leq0.5$, Si doped $In_xAl_{1-x}As$, where $0<x\leq0.7$, Be doped $In_xAl_{1-x}As$, where $0<x\leq0.7$, or C doped $In_xAl_{1-x}As$, where $0<x\leq0.7$. The Schottky contact layer 507 may be formed of n-type $Al_xGa_{1-x}As$, where $0<x\leq0.5$. Similarly, the negative fixed charges in the halogen-doped aluminum oxide layer 410 help to distract the electrons away from the surface 508a of the semiconductor layer 508.

As a result, the electron mobility of the semiconductor device 500*a* (i.e., HEMT) can be increased.

FIG. 6B is a cross-sectional view showing a semiconductor device 500*b* according to an exemplary embodiment. Elements in FIG. 6B that are the same as those in FIG. 6A are labeled with the same reference numbers as in FIG. 6A and are not described again for brevity. Hereafter, the fabrication method and the structure of a semiconductor device 500*b* is illustrated with reference made to FIG. 6B. In the following description, the semiconductor device 500*b* implemented as a HEMT as an example will be illustrated.

The embodiment shown in FIG. 6B is similar to the embodiment shown in FIG. 6A. The main difference therebetween is that in the embodiment shown in FIG. 6B, the semiconductor layer 508' further comprise an additional capping layer 509 formed between the Schottky contact layer 507 and the halogen-doped aluminum oxide layer 410, and adjacent to the source/drain electrode layers 409 and 41. The halogen-doped aluminum oxide layer 410 is formed on a surface of the semiconductor layer 508' to cover the surface 508*b* and sidewall of the capping layer 509 and the surface 508*a* of the Schottky contact layer 507. Moreover, the buffer layer 502 may comprise a first layer and an overlying second layer which are formed of intrinsic $In_xAl_{1-x}As$, where $0<x\leq0.7$. The first and second spacer layers 503 and 505 may be formed of intrinsic $In_xAl_{1-x}As$, where $0<x\leq0.7$. The Schottky contact layer 507 may be formed of intrinsic $In_xAl_{1-x}As$, where $0<x\leq0.7$. The capping layer 509 may be formed of n-type $In_xGa_{1-x}As$, where $0<x\leq0.7$.

FIG. 6C is a cross-sectional view showing a semiconductor device 500*c* according to an exemplary embodiment. Elements in FIG. 6C that are the same as those in FIG. 6B are labeled with the same reference numbers as in FIG. 6B and are not described again for brevity. Hereafter, the fabrication method and the structure of a semiconductor device 500*c* is illustrated with reference made to FIG. 6C. In the following description, the semiconductor device 500*c* implemented as a HEMT as an example will be illustrated.

The embodiment shown in FIG. 6C is similar to the embodiment shown in FIG. 6B. The main difference therebetween is that in the embodiment shown in FIG. 6C, the multiple layer structure of a semiconductor layer 508" may comprise a stack of a buffer layer 602, a channel layer 504, a spacer layer 605, a carrier supply layer 606, and a Schottky contact layer 507. Moreover, the buffer layer 602, the spacer layer 605, and the Schottky contact layer 507 may be formed of intrinsic GaAs. The carrier supply layer 606 and the capping layer 509 may be formed of $n^+$-type GaAs.

Thereafter, a plurality of examples is provided to further illustrate embodiments of the disclosure.

EXAMPLE 1

A p-type wafer is provided. After the wafer is cleaned, the p-type wafer is dipped in a nitric acid solution which has a concentration of 69% for 15 minutes to form a silicon oxide layer on the surface of the p-type wafer.

After the wafer is cleaned and dried, a precursor solution used for spray coating a halogen-doped aluminum oxide layer on the silicon oxide layer is prepared. The method for forming the precursor solution is provided in the flowing description.

13 g of aluminum acetylacetonate and 1.5 g of ammonium fluoride are put into a solvent including 100 g of methanol, 300 g of water, and 30 g of acetic acid and stirred to form a solution including an aluminum-containing compound solution and a halogen-containing compound solution.

Then, the cleaned wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on an upper surface of the silicon oxide layer on the wafer to form a fluorine doped aluminum oxide layer, wherein the spray coating time is 30 minutes. After opposite sides of the wafer are spray coated, the wafer is measured to identify the carrier lifetime.

EXAMPLE 2

A p-type wafer is provided. After the wafer is cleaned, the p-type wafer is dipped in a nitric acid solution which has a concentration of 69% for 15 minutes to form a silicon oxide layer on the surface of the p-type wafer.

After the wafer is cleaned and dried, a precursor solution used for spray coating a halogen-doped aluminum oxide layer on the silicon oxide layer is prepared. The method for forming the precursor solution is provided in the flowing description.

13 g of aluminum acetylacetonate and 5.3 g of ammonium fluoride are put into a solvent including 100 g of methanol, 300 g of water, and 30 g of acetic acid and stirred to form a solution including an aluminum-containing compound solution and a halogen-containing compound solution.

Then, the cleaned wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on an upper surface of the silicon oxide layer on the wafer to form a fluorine doped aluminum oxide layer, wherein the spray coating time is 30 minutes. After opposite sides of the wafer are spray coated, the wafer is measured to identify the carrier lifetime.

COMPARATIVE EXAMPLE 1

The preparation method of the Comparative example 1 is substantially the same as that of the Example 1 and 2. The main difference is that no halogen-doped aluminum oxide layer is formed in the Comparative example 1. Only an aluminum oxide layer is spray coated onto a wafer. That is, no ammonium fluoride or aluminum acetylacetonate is added in the solution for spray coating.

COMPARATIVE EXAMPLE 2

The preparation method of the Comparative example 2 is substantially the same as that of the Example 1 and 2. The main difference is that no halogen-doped aluminum oxide layer is formed in the Comparative example 2. Only an aluminum oxide layer is formed on the passivation layer by an atomic deposition process. After opposite sides of the wafer are coated by the aluminum oxide layer, the wafer is annealed at a nitrogen atmosphere for 30 minutes.

Then, the wafers of the Example 1, the Example 2, the Comparative example 1, and the Comparative example 2 are measured to identify their carrier lifetimes, respectively. The results are listed in Table 1.

TABLE 1

|  | Carrier Lifetime (μs) |
| --- | --- |
| Example 1 | 101 |
| Example 2 | 67 |
| Comparative Example 1 | 36 |
| Comparative Example 2 | 103 |

As shown in Table 1, the carrier lifetimes of the Example 1 and the Example 2 are significantly higher than that of the Comparative example 1. It is possible that because the embodiments of the disclosure include the halogen-doped aluminum oxide layer, negative fixed charges of the aluminum oxide layer is increased and the field passivation ability of the aluminum oxide is improved, thus increasing the carrier lifetime. In addition, the carrier lifetimes of the Example 1 and the Example 2 are both close to that of the Comparative example 2. Thus, the halogen-doped aluminum oxide layer of embodiments of the disclosure and the aluminum oxide layer formed by atomic deposition process have similar passivation ability. Note that the halogen-doped aluminum oxide layer of embodiments of the disclosure is formed at a low temperature. A heat treatment is not required after the aluminum oxide layer is formed. Fabrication time is significantly reduced. No vacuum equipment is required, thus significantly reducing fabrication costs.

EXAMPLE 3

A bottom-gate TFT device on a wafer is provided, wherein the TFT device has an IGZO layer serving as an active layer. Next, a precursor solution used for spray coating a halogen-doped aluminum oxide layer on the IGZO layer is prepared. The method for forming the precursor solution is provided in the flowing description.

13 g of aluminum acetylacetonate and 5.3 g of ammonium fluoride are put into a solvent including 100 g of methanol, 300 g of water, and 30 g of acetic acid and stirred to form a solution including an aluminum-containing compound solution and a halogen-containing compound solution.

Then, the wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on an upper surface of the IGZO layer to form a fluorine doped aluminum oxide layer, wherein the spray coating time is 30 minutes. After the IGZO layer is spray coated, the wafer is measured to identify the electron mobility of the bottom-gate TFT device.

COMPARATIVE EXAMPLE 3

The preparation method of the Comparative example 3 is substantially the same as that of the Example 3. The main difference is that no halogen-doped aluminum oxide layer is formed in the Comparative example 3. That is, no ammonium fluoride or aluminum acetylacetonate is added in the solution for spray coating.

Then, the wafers of the Example 3 and the Comparative example 3 are measured to identify their respective electron mobilities. The results are listed in Table 2.

TABLE 2

|  | Electron Mobility (cm/V · s) |
| --- | --- |
| Example 3 | 3.10 |
| Comparative Example 3 | 1.21 |

As shown in Table 2, the electron mobility of the Example 3 is significantly higher than that of the Comparative example 3. It is possible that because the embodiment of the disclosure includes the halogen-doped aluminum oxide layer, negative fixed charges of the aluminum oxide layer are increased and the field passivation ability of the aluminum oxide is improved, thus increasing the electron mobility. Similarly, the halogen-doped aluminum oxide layer of the embodiment of the disclosure is formed at a low temperature without using vacuum equipments, thus significantly reducing fabrication time and costs.

EXAMPLE 4

An LED device on a wafer is provided, wherein the LED device comprises a p-type GaN layer and an n-type GaN layer serving as hole and electron supplying layers, respectively. Next, a precursor solution used for spray coating a halogen-doped aluminum oxide layer on the p-type and n-type GaN layers is prepared. The method for forming the precursor solution is provided in the flowing description.

13 g of aluminum acetylacetonate and 5.3 g of ammonium fluoride are put into a solvent including 100 g of methanol, 300 g of water, and 30 g of acetic acid and stirred to form a solution including an aluminum-containing compound solution and a halogen-containing compound solution.

Then, the wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on upper surfaces of the p-type and n-type GaN layers to form a fluorine doped aluminum oxide layer, wherein the spray coating time is 30 minutes. After the p-type and n-type GaN layers are spray coated, the wafer is measured to identify the light output power and the operation voltage of the LED device.

COMPARATIVE EXAMPLE 4

The preparation method of the Comparative example 4 is substantially the same as that of the Example 4. The main difference is that no halogen-doped aluminum oxide layer is formed in the Comparative example 4. That is, no ammonium fluoride or aluminum acetylacetonate is added in the solution for spray coating.

Then, the wafers of the Example 4 and the Comparative example 4 are measured to identify their light output powers and operation voltages, respectively, under an operation current of 350 mA. The results are listed in Table 3.

TABLE 3

|  | Light Output Power (mW) | Operation Voltage (V) |
| --- | --- | --- |
| Example 4 | 221.1 | 4.05 |
| Comparative Example 4 | 207.5 | 4.27 |

As shown in Table 3, the light output power of the Example 4 is significantly higher than that of the Comparative example 4 and the operation voltage of the Example 4 is significantly lower than that of the Comparative example 4. It is possible that because the embodiment of the disclosure includes the halogen-doped aluminum oxide layer, negative fixed charges of the aluminum oxide layer is increased and the field passivation ability of the aluminum oxide is improved, thus increasing the light output power and reducing the operation voltage. Similarly, the halogen-doped aluminum oxide layer of the embodiment of the disclosure is formed at a low temperature without using vacuum equipments, thus significantly reducing fabrication time and costs.

EXAMPLE 5

An HEMT device on a wafer is provided, wherein the HEMT device has a top AlGaN layer serving as a barrier layer. Next, a precursor solution used for spray coating a halogen-doped aluminum oxide layer on the AlGaN layer is prepared. The method for forming the precursor solution is provided in the flowing description.

13 g of aluminum acetylacetonate and 5.3 g of ammonium fluoride are put into a solvent including 100 g of methanol, 300 g of water, and 30 g of acetic acid and stirred to form a solution including an aluminum-containing compound solution and a halogen-containing compound solution.

Then, the wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on an upper surface of the AlGaN layer to form a fluorine doped aluminum oxide layer, wherein the spray coating time is 30 minutes. After the AlGaN layer is spray coated, the wafer is measured to identify the maximum saturation current ($I_{DS, max}$) of the HEMT device.

COMPARATIVE EXAMPLE 5

The preparation method of the Comparative example 5 is substantially the same as that of the Example 5. The main difference is that no halogen-doped aluminum oxide layer is formed in the Comparative example 5. That is, no ammonium fluoride or aluminum acetylacetonate is added in the solution for spray coating.

Then, the wafers of the Example 5 and the Comparative example 5 are measured to identify their maximum saturation current ($I_{DS, max}$), respectively, under an operation voltage ($V_{GS}$) of 2 Volt. The results are listed in Table 4.

TABLE 4

| | $I_{DS, max}$ (mA/mm) |
|---|---|
| Example 5 | 754 |
| Comparative Example 5 | 627 |

As shown in Table 4, the maximum saturation current of the Example 5 is significantly higher than that of the Comparative example 5. It is possible that because the embodiment of the disclosure includes the halogen-doped aluminum oxide layer, negative fixed charges of the aluminum oxide layer are increased and the field passivation ability of the aluminum oxide is improved, thus increasing the maximum saturation current. Similarly, the halogen-doped aluminum oxide layer of the embodiment of the disclosure is formed at a low temperature without using vacuum equipments, thus significantly reducing fabrication time and costs.

EXAMPLE 6

A MOS-HEMT device on a wafer is provided, wherein the MOS-HEMT device has a top AlGaN layer serving as a barrier layer. Next, a precursor solution used for spray coating a halogen-doped aluminum oxide layer on the AlGaN layer is prepared. The method for forming the precursor solution is provided in the flowing description.

13 g of aluminum acetylacetonate and 5.3 g of ammonium fluoride are put into a solvent including 100 g of methanol, 300 g of water, and 30 g of acetic acid and stirred to form a solution including an aluminum-containing compound solution and a halogen-containing compound solution.

Then, the wafer is disposed on a substrate which is capable of heating the wafer. The temperature of the wafer is then elevated to be 350° C.

Then, an ultrasonic wave is applied to the solution including the aluminum-containing compound solution and the halogen-containing compound solution to generate vapor of the solution. Then, the vapor of the solution is carried by an air flow of 10 L/minute and spray coated on an upper surface of the AlGaN layer to form a fluorine doped aluminum oxide layer, wherein the spray coating time is 30 minutes. After the AlGaN layer is spray coated, the wafer is measured to identify the maximum saturation current ($I_{DS, max}$) of the HEMT device.

COMPARATIVE EXAMPLE 6

The preparation method of the Comparative example 6 is substantially the same as that of the Example 6. The main difference is that no halogen-doped aluminum oxide layer is formed in the Comparative example 6. That is, no ammonium fluoride or aluminum acetylacetonate is added in the solution for spray coating.

Then, the wafers of the Example 6 and the Comparative example 6 are measured to identify their maximum saturation current ($I_{DS, max}$), respectively, under an operation voltage ($V_{GS}$) of 2 Volt. The results are listed in Table 5.

TABLE 5

| | $I_{DS, max}$ (mA/mm) |
|---|---|
| Example 6 | 749 |
| Comparative Example 6 | 627 |

As shown in Table 5, the maximum saturation current of the Example 6 is significantly higher than that of the Comparative example 6. It is possible that because the embodiment of the disclosure includes the halogen-doped aluminum oxide layer, negative fixed charges of the aluminum oxide layer are increased and the field passivation ability of the aluminum oxide is improved, thus increasing the maximum saturation current. Similarly, the halogen-doped aluminum oxide layer of the embodiment of the disclosure is formed at a low temperature without using vacuum equipments, thus significantly reducing fabrication time and costs.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A passivation layer structure of a semiconductor device, comprising:
   a semiconductor layer disposed on a substrate, wherein a surface of the semiconductor layer comprises metal oxides or nitride-based III-V compounds; and
   a passivation layer structure disposed on the semiconductor layer, wherein the passivation layer structure comprises a halogen-doped aluminum oxide layer including an aluminum oxide layer and at least a halogen dopant doped therein.

2. The passivation layer structure of a semiconductor device as claimed in claim 1, wherein a halogen in the halogen-doped aluminum oxide layer comprises fluorine, chlorine, bromine, or iodine.

3. The passivation layer structure of a semiconductor device as claimed in claim 1, wherein the halogen-doped aluminum oxide layer has a thickness between 10 nm and 400 nm.

4. The passivation layer structure of a semiconductor device as claimed in claim 1, wherein a doping concentration of halogen in the halogen-doped aluminum oxide layer is between 0.01% and about 5%.

5. The passivation layer structure of a semiconductor device as claimed in claim 1, wherein the nitride-based III-V compounds comprises gallium nitride or aluminum gallium nitride.

6. The passivation layer structure of a semiconductor device as claimed in claim 1, wherein the substrate comprises silicon, silicon carbide, sapphire, or glass.

7. The passivation layer structure of a semiconductor device as claimed in claim 1, wherein the semiconductor device comprises a thin film transistor, a high electron mobility transistor, a light-emitting diode, a photodiode, or a pH sensor.

8. The passivation layer structure of a semiconductor device as claimed in claim 1, wherein the metal oxides comprises indium gallium zinc oxide, hafnium indium zinc oxide, indium tin oxide, zinc oxide, aluminum doped zinc oxide, antimony doped tin oxide, tin doped zinc oxide or fluorine doped tin oxide.

9. A method for forming the passivation layer structure of a semiconductor device as claimed in claim 1, wherein the formation of the halogen-doped aluminum oxide layer comprises:
   applying a solution on the surface of the semiconductor layer, wherein the solution comprises an aluminum-containing compound solution and a halogen-containing compound solution; and
   heating the semiconductor layer to a temperature, such that the solution transforms into the halogen-doped aluminum oxide layer.

10. The method as claimed in claim 9, wherein the aluminum-containing compound solution comprises aluminum acetylacetonate, aluminum chloride, aluminum nitrate, trimethyl aluminum, or combinations thereof.

11. The method as claimed in claim 9, wherein the halogen-containing compound solution comprises ammonium fluoride, hydrofluoric acid, ammonium chloride, hydrochloric acid, ammonium bromide, hydrobromic acid, or combinations thereof.

12. The method as claimed in claim 9, wherein the solution is applied on the surface of the semiconductor layer by a spray coating process or a spin coating process.

13. The method as claimed in claim 9, wherein the temperature is between 100° C. and 500° C.

14. A passivation layer structure of a high electron mobility transistor, comprising:
   a semiconductor layer disposed on a substrate, wherein a surface of the semiconductor layer comprises intrinsic or n-type III-V compounds; and
   a passivation layer structure disposed on the semiconductor layer, wherein the passivation layer structure comprises a halogen-doped aluminum oxide layer including an aluminum oxide layer and at least a halogen dopant doped therein.

15. The passivation layer structure of a high electron mobility transistor as claimed in claim 14, wherein a halogen in the halogen-doped aluminum oxide layer comprises fluorine, chlorine, bromine, or iodine.

16. The passivation layer structure of a high electron mobility transistor as claimed in claim 14, wherein the halogen-doped aluminum oxide layer has a thickness between 10 nm and 400 nm.

17. The passivation layer structure of a high electron mobility transistor as claimed in claim 14, wherein a doping concentration of halogen in the halogen-doped aluminum oxide layer is between 0.01% and about 5%.

18. The passivation layer structure of a high electron mobility transistor as claimed in claim 14, wherein the intrinsic or n-type III-V compounds comprises gallium arsenide, aluminum gallium arsenide or indium aluminum arsenide.

19. The passivation layer structure of a high electron mobility transistor as claimed in claim 14, wherein the substrate comprises silicon or gallium arsenide.

20. A method for forming the passivation layer structure of a high electron mobility transistor as claimed in claim 14, wherein the formation of the halogen-doped aluminum oxide layer comprises:
   applying a solution on the surface of the semiconductor layer, wherein the solution comprises an aluminum-containing compound solution and a halogen-containing compound solution; and
   heating the semiconductor layer to a temperature, such that the solution transforms into the halogen-doped aluminum oxide layer.

21. The method as claimed in claim 20, wherein the aluminum-containing compound solution comprises aluminum acetylacetonate, aluminum chloride, aluminum nitrate, trimethyl aluminum, or combinations thereof.

22. The method as claimed in claim 20, wherein the halogen-containing compound solution comprises ammonium fluoride, hydrofluoric acid, ammonium chloride, hydrochloric acid, ammonium bromide, hydrobromic acid, or combinations thereof.

23. The method as claimed in claim 20, wherein the solution is applied on the surface of the semiconductor layer by a spray coating process or a spin coating process.

24. The method as claimed in claim 20, wherein the temperature is between 100° C. and 500° C.

* * * * *